United States Patent
Chang et al.

(10) Patent No.: US 6,943,068 B2
(45) Date of Patent: Sep. 13, 2005

(54) METHOD FOR FABRICATING NANOMETER GATE IN SEMICONDUCTOR DEVICE USING THERMALLY REFLOWED RESIST TECHNOLOGY

(75) Inventors: Edward Y. Chang, Hsinchu (TW); Huang-Ming Lee, Chiayi (TW)

(73) Assignee: National Chiao Tung University, Hsinchu (TW)

( * ) Notice: Subject to any disclaimer, the term of this patent is extended or adjusted under 35 U.S.C. 154(b) by 0 days.

(21) Appl. No.: 10/715,743

(22) Filed: Nov. 17, 2003

(65) Prior Publication Data

US 2004/0229409 A1 Nov. 18, 2004

(30) Foreign Application Priority Data

May 13, 2003 (TW) .................................. 92112920 A

(51) Int. Cl.[7] .............................................. H01L 21/338
(52) U.S. Cl. ...................... 438/167; 430/313; 430/330; 438/182; 438/725
(58) Field of Search ................................ 430/296, 311, 430/313, 330; 438/167, 182–184, 652, 704, 725

(56) References Cited

U.S. PATENT DOCUMENTS

| | | | |
|---|---|---|---|
| 4,363,830 A | | 12/1982 | Hsu et al. |
| 4,523,000 A | * | 6/1985 | Hatada et al. .............. 526/336 |
| 4,824,767 A | | 4/1989 | Chambers et al. |
| 4,830,974 A | | 5/1989 | Chang et al. |
| 4,935,380 A | | 6/1990 | Okumura |
| 5,006,480 A | | 4/1991 | Chang et al. |
| 5,552,342 A | | 9/1996 | Itou et al. |
| 5,712,175 A | * | 1/1998 | Yoshida ....................... 438/167 |
| 5,716,891 A | | 2/1998 | Kodama |
| 5,728,627 A | | 3/1998 | Nam et al. |

(Continued)

OTHER PUBLICATIONS

*Formation of submicron T–gate by rapid thermally reflowed resist with metal transfer layer*, C.C. Meng, G.R. Liao and S.S. Lu: Electronics Letters, vol. 37 No. 16 (2001) pp. 1045–1046.

*Thermal Flow and Chemical Shrink Techniques for Sub–100 nm Contact Hole Fabrication in Electron Beam Lithography*, Hsuen–Li Chen, Fu–Hsiang Ko, Lung–Sheng Li, Chien–Kui Hsu, Ben–Chang Chen and Tieh–Chi Chu: Jpn. J. Appl. Phys. vol. 41 (2002) pp. 4163–4166.

*Fabrication of 0.2 µm Gate Pseudomorphic Inverted Hemt By Phase–Shifting Technology*, H.T. Yamasa, R. Shigemasa, H.I. Fujihiro, S. Nishi and T. Saito: Solid State Electronics vol. 38, No. 9 pp. 1631–1634, 1995.

(Continued)

*Primary Examiner*—Asok Kumar Sarkar
(74) *Attorney, Agent, or Firm*—Bucknam and Archer

(57) ABSTRACT

The invention relates to a method for fabricating nanometer gate semiconductor device using thermally reflowed photoresist technology, comprising steps of (i) spin-coating two layers of photoresists on a substrate, where a bottom layer of photoresist is a polymeric photoresist having a lower sensitivity and a higher resolution, and a top layer of photoresist, is another polymeric photoresist having a higher sensitivity and a lower resolution, with respect to the electron beam; (ii) heating the photoresists for curing by way of using a hotplate; (iii) using photolithography in an electron beam direct writing manner to expose a pattern on the photoresists for forming a gate; (iv) using a developer and an etchant for developing and etching to form a recess on the gate; (v) plating a metallic layer on the recess of the gate using an electron gun evaporation technique; and (vi) removing the photoresists to obtain the gate, characterized in that after the etching of the recess of the gate, the photoresists are reflowed by using a hot plate heating manner within a predetermined period of time and temperature, such that the recess of the gate is formed with a nanometer-sized width.

11 Claims, 4 Drawing Sheets

U.S. PATENT DOCUMENTS

| | | | |
|---|---|---|---|
| 5,759,886 | A | 6/1998 | Chung |
| 5,834,346 | A | 11/1998 | Sun et al. |
| 5,918,142 | A | 6/1999 | Park et al. |
| 6,051,454 | A * | 4/2000 | Anda et al. .................. 438/167 |
| 6,143,626 | A | 11/2000 | Yabu et al. |
| 6,767,693 | B1 * | 7/2004 | Okoroanyanwu ........... 430/311 |
| 2003/0129818 | A1 * | 7/2003 | Inai et al. .................... 438/595 |

OTHER PUBLICATIONS

*30–nm–Gate InP–Based Lattice–Matched High Electron Mobility Transistors with 350 GHz Cutoff Frequency*, T. Suemitsu, T. Ishii, H. Yokoyama, T. Enoki, Y. Ishii and T. Tamamura: Jpn. J. Appl. Phys. vol. 38 (1999) pp. L154–156.

*Improved Recessed–Gate Structure for Sub–0.1–μm–Gate InP–Based High Electron Mobility Transistors*, T. Suemitsu, T. Enoki, H. Yokoyama and Y. Ishii: Jpn. J. Appl. Phys. vol. 37 (1998) pp. 1365–1372.

*Ultra–Short 23–nm–Gate Lattice–Matched InAlAs/InGaAs HEMTs within the Range of 400 GHz Cutoff Frequency*, Yoshimi Yamashita, Akira Endoh, Keisuke Shinohara, Masataka Higashiwaki, Kohki Hikosaka and Takashi Mimura: IEEE Electron Device Letters. vol. 22 No. 8 (2001) 367–369.

* cited by examiner (a)

(b)

(c)

(d)

METHOD FOR FABRICATING NANOMETER GATE IN SEMICONDUCTOR DEVICE USING THERMALLY REFLOWED RESIST TECHNOLOGY

CROSS-REFERENCE TO RELATED APPLICATIONS

This application claim priority to and the benefit of Taiwan Patent Application No. 092112920, filed May 13, 2003, the entire disclosure of which is incorporated herein by reference.

BACKGROUND

1. Field of the Invention

The invention relates to a method for fabricating nanometer gate semiconductor device using thermally reflowed photoresist technology and, more specifically, to a method for fabricating nanometer gate semiconductor device using combination of an electron beam photolithography and a thermally reflowed photoresist technology.

2. Related Arts of the Invention

Conventionally, in order to promote the performance of the high frequency semiconductor device, such as higher cut-off frequency and maximum resonance frequency, except to develop the structure of the element with a high mobility, the shrinkage of the gate width is also another approach to achieve, where the nanometer photolithography is a critical technique to manufacture such a nanometer gate semiconductor device.

In the literature of IEEE Electron Device Lett. 22(2001) 367, entitled "Ultra-Short 25-nm-Gate Lattice-Matched InAlAs/InGaAs HEMTs within the Range of 400 Ghz Cut-off Frequency", proposed by Yoshimi Yamashita, Akira Endoh, Keisuke Shinohara, Masataka Hikashiwaki, Kohki Hikosaka and Takashi Mimura, described that the high performance devices that operate in the millimeter-wave (30 to 300 GHz) and sub-millimeter-wave (300 GHz to 3 THz) frequency ranges will be major elements of the future communication system. InP-based InAlAs/InGaAs high electron mobility transistors (HEMTs) are the most promising candidates, since this material system provides high electron mobilities, high saturation velocities, and high sheet electron densities. In both field-effect transistors (FETs) and HEMTs high-speed characteristics can essentially be obtained by reducing the gate length.

However, as described on above, due to the short gate width, it is not easy to attach the gate on the surface of the substrate which may cause the problem of gate loose. Consequently, how to fixedly attach the gate on the substrate becomes another subject for the research. Furthermore, the influence of the shape of gate in DC and high frequency features of the device is also worthy of study. However, these two subjects are not failed in the scope of the invention.

Therefore, it is necessary to develop a method for fabricating a sub-micron, i.e. nanometer gate, capable of using a simplified heating process for fabrication of a nanometer gate having line width smaller than 0.1 micrometer (order of nanometers) without any expensive apparatus (e.g. the yellow light photolithography apparatus) and high technical level of manufacturing process, which makes it possible to achieve a fine line width and simplify the manufacturing process, so as to reduce the cost and improve the yield effectively.

SUMMARY OF THE INVENTION

In view of the above described conventional problems, the object of the invention is to provide a method for fabricating nanometer gate semiconductor device using thermally reflowed photoresist technology, capable of using a simplified heating process for fabrication of a nanometer gate having line width smaller than 0.1 micrometer without any expensive apparatus and high technical level of manufacturing process, which makes it possible to achieve a fine line width and simplify the manufacturing process, so as to reduce the cost and improve the yield effectively.

To achieve the above object, according to one aspect of the invention, a method for fabricating nanometer gate semiconductor device using thermally reflowed photoresist technology is provided, comprising the steps of:

(i) spin-coating two layers of photoresists on a substrate in order, where a bottom layer of photoresist, one of the two layers of photoresists, is a polymeric photoresist which has a lower sensitivity and a higher resolution with respect to an electron beam, and a top layer of photoresist, one of the two layers of photoresists, is another polymeric photoresist which has a higher sensitivity and a lower resolution with respect to the electron beam;

(ii) heating the two layers of photoresists for curing these layers by way of using a hotplate;

(iii) using photolithography with a high accelerating voltage in an electron beam direct writing manner to expose a pattern on the two layers of photoresists for forming a gate;

(iv) using a developer and an etchant for developing and etching in order to form a recess on the gate;

(v) plating a metallic layer on the recess of the gate by way of using an electron gun evaporation technique; and (vi) removing the photoresists to obtain the gate, characterized in that after the etching of the recess of the gate, the photoresists are reflowed by using a hot plate heating manner within a predetermined period of time and temperature, such that the recess of the gate is formed with a nanometer-sized width.

Further, according to the above aspect of the invention, the bottom layer of photoresist is a PMMA (polymethyl methacrylate) photoresist or a LOR (lift-off) photoresist.

Further, according to the above aspect of the invention, the top layer of photoresist is a P(MMA-MAA) (poly (methacrylate-methyl acrylic acid)) photoresist or a PMGI (polymethylglutarimide) photoresist.

Further, according to the above aspect of the invention, the metallic layer is a Ti/Pt/Au Schottky metallic layer.

Further, according to the above aspect of the invention, the predetermined period of time and temperature for the reflow of said photoresists are about 75 seconds and about 125° C., respectively, and the heating manner employs a bottom heating manner.

Further, according to the above aspect of the invention, the heating temperatures for the bottom and top layers of said photoresists are about 250° C. and 180° C., respectively, and the heating time of each layer is about 3 minutes.

Further, according to the above aspect of the invention, the step of removing the photoresists employs acetone to remove said photoresists.

Further, according to the above aspect of the invention, the recess of the gate is T-shaped.

Further, according to the above aspect of the invention, the substrate is a GaAs substrate.

Further, according to the above aspect of the invention, the developer is a MIBK:IPA=1:3 high resolution developer.

Further, according to the above aspect of the invention, the photoresists are at least two layers of multi-layered photoresists structure containing PMMA, LOR, PMGI, and P(MMA-MAA).

BRIEF DESCRIPTION OF THE DRAWINGS

The invention will present in detail the following description of the preferred embodiments with reference to the following drawings, in that the same reference number represents the identical element, wherein.

DESCRIPTION OF THE PREFERRED EMBODIMENTS

Figure 1:
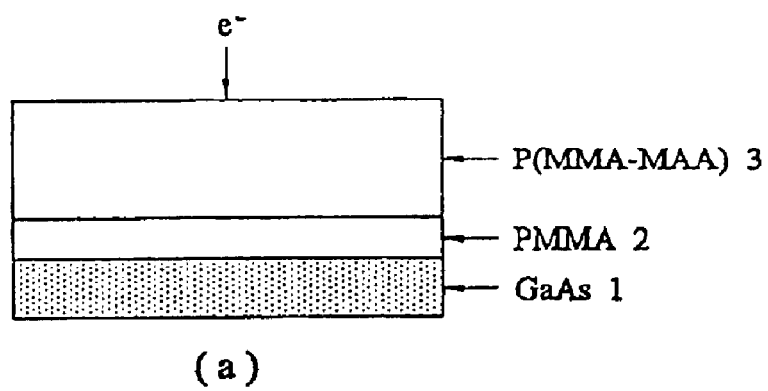
FIG. 1(a) to 1(d) are schematic views, showing manufacturing process steps according to an embodiment of the invention.
Figure 1:
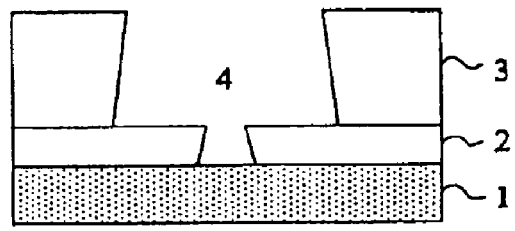
Figure 1:
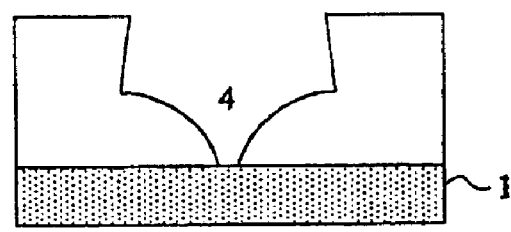
Figure 1:
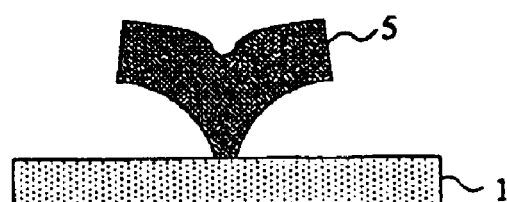

Hereinafter, the invention will now be described more fully with reference to the accompanying drawings, in which preferred embodiments of the invention are shown and the same reference numeral indicates the identical element. However, the person who is skillful in the art should appreciate that these embodiments are just illustrative of the invention and should not be construed as being limited to the embodiments set forth herein. Note that the modifications and variations can be made without departing from the spirit and scope of the invention.

Figure 2:
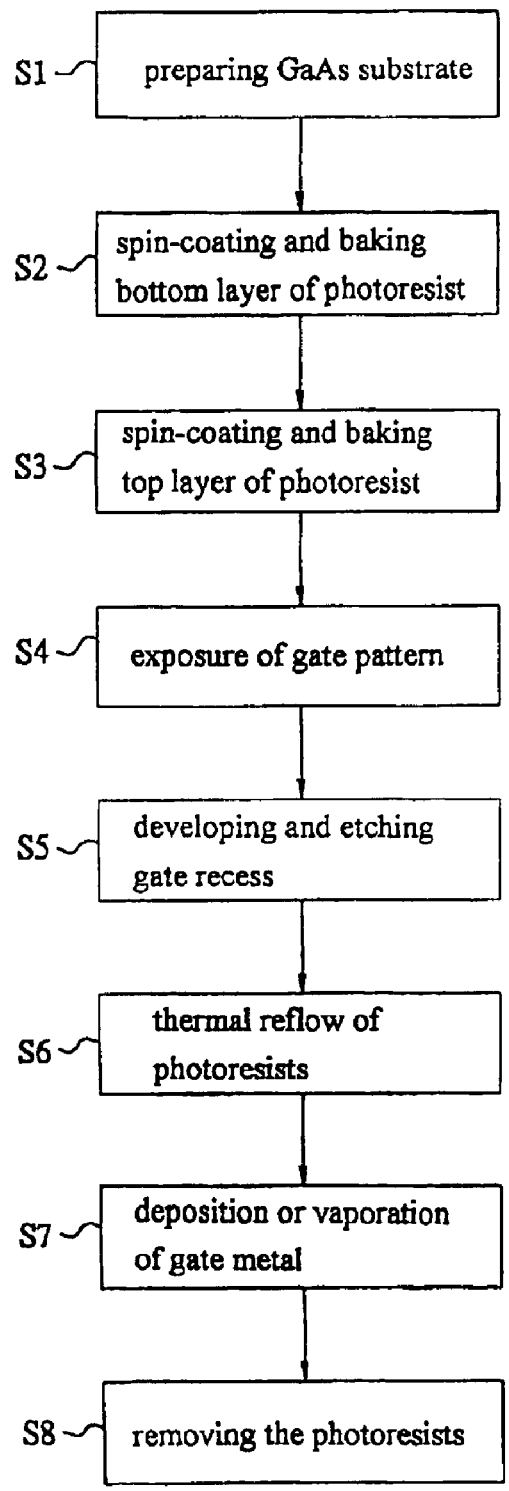
FIG. 2 is a flow chart, illustrating the method according to the embodiment of the invention.

Referring to FIG. 1(a) to 1(d), show manufacturing process steps of a structural embodiment according to the method for fabricating a nanometer gate of the invention, and referring to FIG. 2, shows a flow chart of the embodiment according to the method of the invention. Firstly, in step S1 of FIG. 2, a substrate 1, such as GaAs is prepared. However, the present invention is not confined in a kind of the substrate, for example these substrates typically used in the fabrication of semiconductor devices can be implemented in accordance with the invention. In steps S2 and S3, two layers of photoresist structures are spin-coated on the GaAs substrate in order by using a spin-coating machine, and baked. Among others, a bottom layer of photoresist, one of the two layers of photoresists, is a polymeric photoresist such as PMMA, which has a lower sensitivity and a higher resolution with respect to an electron beam, and a top layer of photoresist, one of the two layers of photoresists, is another polymeric photoresist such as P(MMA-MAA), which has a higher sensitivity and a lower resolution with respect to the electron beam. In order to obtain an optimal resolution for the photoresist, these two layers of the photoresists are heated by a hot plate, respectively, such that these two layers of the photoresists are cured. The heating temperatures of which are about 250° C. and 180° C., respectively, and the heating time of each layer is around 3 minutes, as shown in FIG. 1(a). However, the present invention is not confined in a kind of the photoresist, for example a PMGI (polymethylglutarimide) photoresist and a LOR (lift-off) photoresist can replace the P(MMA-MAA) (poly(methacrylate-methyl acrylic acid)) photoresist and PMMA (polymethyl methacrylate) photoresist, respectively.

Next, in step S4, an electron beam photolithography with 40,000 volts accelerating voltage is used in a directly writing manner to expose a photoresist structure of a gate having a T-shaped pattern. Then, in step S5, using a high resolution developer (MIBK:IPA=1:3) to develop and etch a T-shaped recess, as the structure shown in FIG. 1(b), where the T-shaped gate structure is employed in order to allow the lower end of the linewidth to be smaller and the upper end of the gate contact much larger.

Then, in step S6, the photoresists are reflowed by using a hot plate through an appropriate period of heating time and temperature to form a desired nanometer gate width. Preferably, the heating time and temperatures for the reflow are about 75 seconds and 125° C., respectively. However, the present invention is not limited to these conditions and not specified in using the hot plate, either. Instead of the hot plate, the oven can also be used for the reflow of the photoresists, as shown in FIG. 1(c).

Finally, in step S7, a metal layer, such as Ti/Pt/Au Schottky metallic layer, is evaporated by the electron gun evaporation system or deposited on the recess of the gate; and in step S8, excess of the photoresists and metal are removed by performing a lift-off process using acetone so as to obtain a nanometer width of the gate, as shown in FIG. 1(d).

As described on above, using a combination of the electron beam photolithography and the thermally reflowed photoresist technique, it is capable of utilizing a simplified heating process (for example, the hot plate or oven heating manner) to fabricate a nanometer gate having line width smaller than 0.1 micrometer without any expensive apparatus and high technical level of manufacturing process, which makes it possible to achieve a fine line width and simplify the manufacturing process, so as to reduce the cost and improve the yield effectively. Also, it allows the semiconductor device to obtain a higher cut-off frequency and a larger oscillating frequency.

Figure 3:
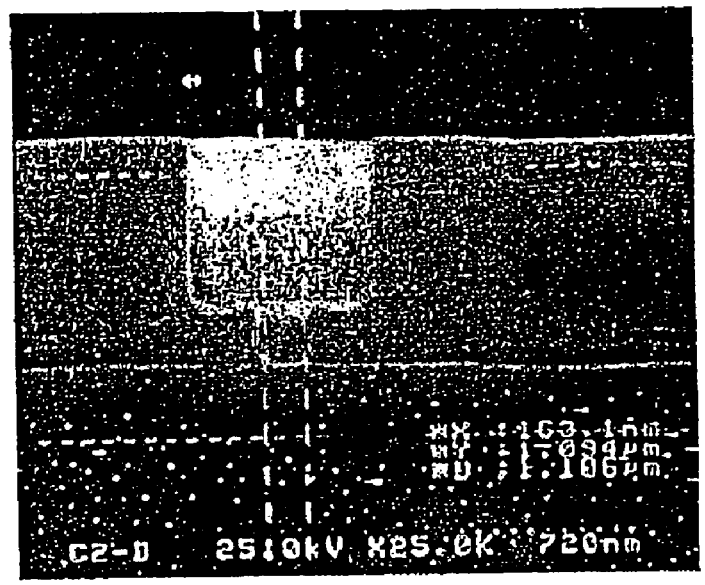
FIG. 3 is a cross section view, showing an electron micrograph of the photoresist before performing the thermal reflow, according to the embodiment of the invention.
Figure 4:
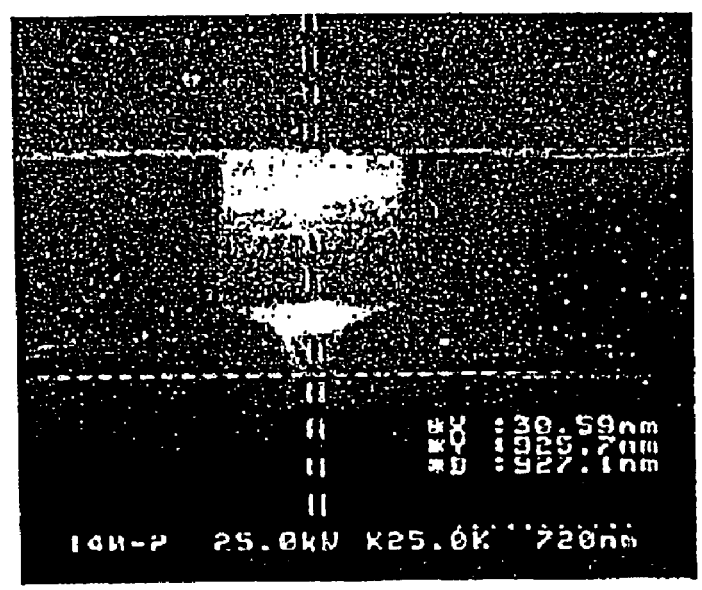
FIG. 4 is a cross section view, showing an electron micrograph of the photoresist after performing the thermal reflow, according to the embodiment of the invention.
Figure 5:
FIG. 5 a cross section view, showing an electron micrograph of the finished nanometer gate according to the embodiment of the method of the invention.

The FIG. 3 to 5 are examples of implementations in accordance with the aspect of the present invention, performed by the inventor. Among others, FIG. 3 is a cross section view, showing an electron micrograph of the photoresist before performing the thermal reflow, according to the embodiment of the method of the invention, where the width of the recess of the gate is about 163.1 nanometers, as indicated by *X; FIG. 4 is a cross section view, showing an electron micrograph of the photoresist after performing the thermal reflow, according to the embodiment of the invention, where the width of the recess of the gate is about 30.59 nanometers; FIG. 5 is a cross section view, showing an electron micrograph of the finished nanometer gate according to the embodiment of the method of the invention, where the line width of gate matel is about 50.0 nanometers.

Figure 6:
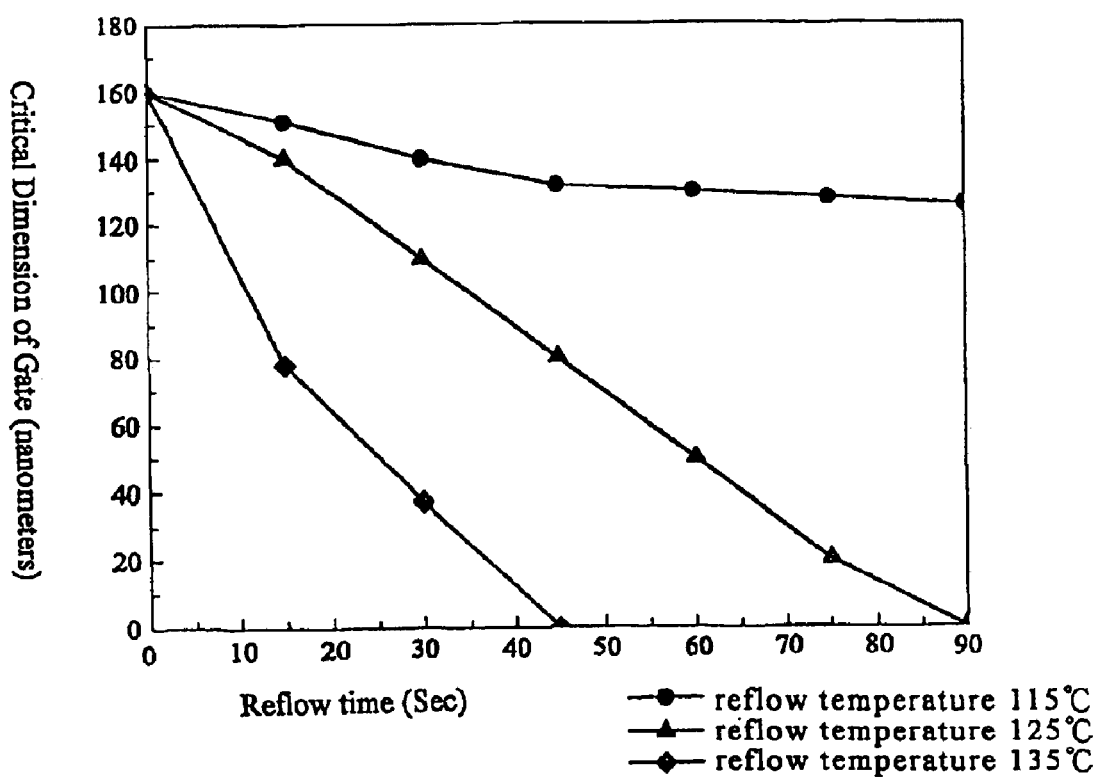
FIG. 6 is a graph, showing the relationship of the thermal reflow time and temperature versus the critical dimension of the gate according to the embodiment of the method of the invention.

FIG. 6 is a graph, showing the relationship of the thermal reflow time and temperature versus the critical dimension of the gate according to the embodiment of the method of the invention. The heating time and temperature of the hot plate can be well-controlled, such that the nanometer width of the recess of the gate can be obtained through the thermal reflow of the photoresists in order to fit with the further process.

Having described the preferred embodiments of the invention on above, however, they are not intended to be the limit of the invention. It should be noted that modifications and variations of the invention can be made by a person who is skillful in the art in light of the above teachings. It is therefore to be understood that various changes, equivalents and modifications may be made in the particular examples of the invention without departing from the scope and the spirit of the invention as outlined by the appended claims.

LIST OF REFERENCE NUMERALS

1 GaAs substrate
2' bottom layer of photoresist
3 top layer of photoresist
4 recess
5 gate mate

What is claimed is:

1. A method for fabricating nanometer gate semiconductor device using thermally reflowed photoresist technology, comprising the following steps:
   (i) spin-coating two layers of photoresists on a substrate, where a bottom layer of photoresist, one of said two layers of photoresists, is a polymeric photoresist which has a lower sensitivity and a higher resolution with respect to an electron beam, and a top layer of photoresist, one of said two layers of photoresists, is another polymeric photoresist which has a higher sensitivity and a lower resolution with respect to the electron beam;
   (ii) heating said two layers of photoresists for curing by way of using a hotplate;
   (iii) using photolithography with a high accelerating voltage in an electron beam direct writing manner to expose a pattern on said two layers of photoresists for forming a gate;
   (iv) using a developer and an etchant for developing and etching in order to form a recess of or for the gate;
   (v) reflowing the photoresists using a hot plate heating manner within a predetermined period of time and temperature, such that the recess of the gate is formed with a nanometer-sized width;
   (vi) plating a metallic layer on the recess of the gate by way of using an electron gun evaporation technique; and
   (vii) removing said photoresists to obtain the gate.

2. The method according to claim 1, wherein said bottom layer of photoresist is a PMMA (polymethyl methacrylate) photoressist or a LOR (lift-off) photoresist.

3. The method according to claim 1, wherein said top layer of photoresist is a P(MMA-MAA)(poly (methacrylate-metlyl acryl acid)) photoresist or a PMGI photoresist.

4. The method according to claim 1, wherein said metallic layer is a Ti/Pt/Au Schottky metallic layer.

5. The method according to claim 1, wherein said predetermined period of time and temperature for the reflow of said photoresists are 75 seconds and 125° C., respectively, and the heating manner employs a bottom heating manner.

6. The method according to claim 1, wherein the heating temperatures for the bottom and top layers of said photoresists are 250° C. and 180° C., respectively, and the heating time of each layer is 3 minutes.

7. The method according to claim 1, wherein said step of removing the photoresists employs acetone to remove said photoresists.

8. The method according to claim 1, wherein the recess of the gate is T-shaped.

9. The method according to claim 1, wherein said substrate is a GaAs.

10. The method according to claim 1, wherein said developer is a MIBK:IPA=1:3 resolution developer.

11. The method according to claim 1, wherein said photoresists are at least two layered of multi-layered photoresists structure containing PMMA, LOR, PMGI, and P(MMA-MAA).

* * * * *